June 30, 1964 D. L. FREDRICKSON 3,139,584

SIGNAL INPUT OVERLOAD PROTECTION ATTENUATION CIRCUIT FOR TRANSISTOR RECEIVERS

Filed May 24, 1962

INVENTOR.

Dennis L. Fredrickson

BY Moody and Kintzinger

Attorneys

United States Patent Office 3,139,584
Patented June 30, 1964

3,139,584
SIGNAL INPUT OVERLOAD PROTECTION ATTENUATION CIRCUIT FOR TRANSISTOR RECEIVERS

Dennis L. Fredrickson, Cedar Rapids, Iowa, assignor to Collins Radio Company, Cedar Rapids, Iowa, a corporation of Iowa Filed May 24, 1962, Ser. No. 197,342
4 Claims. (Cl. 325—362)

Figures 1, 2, 3:
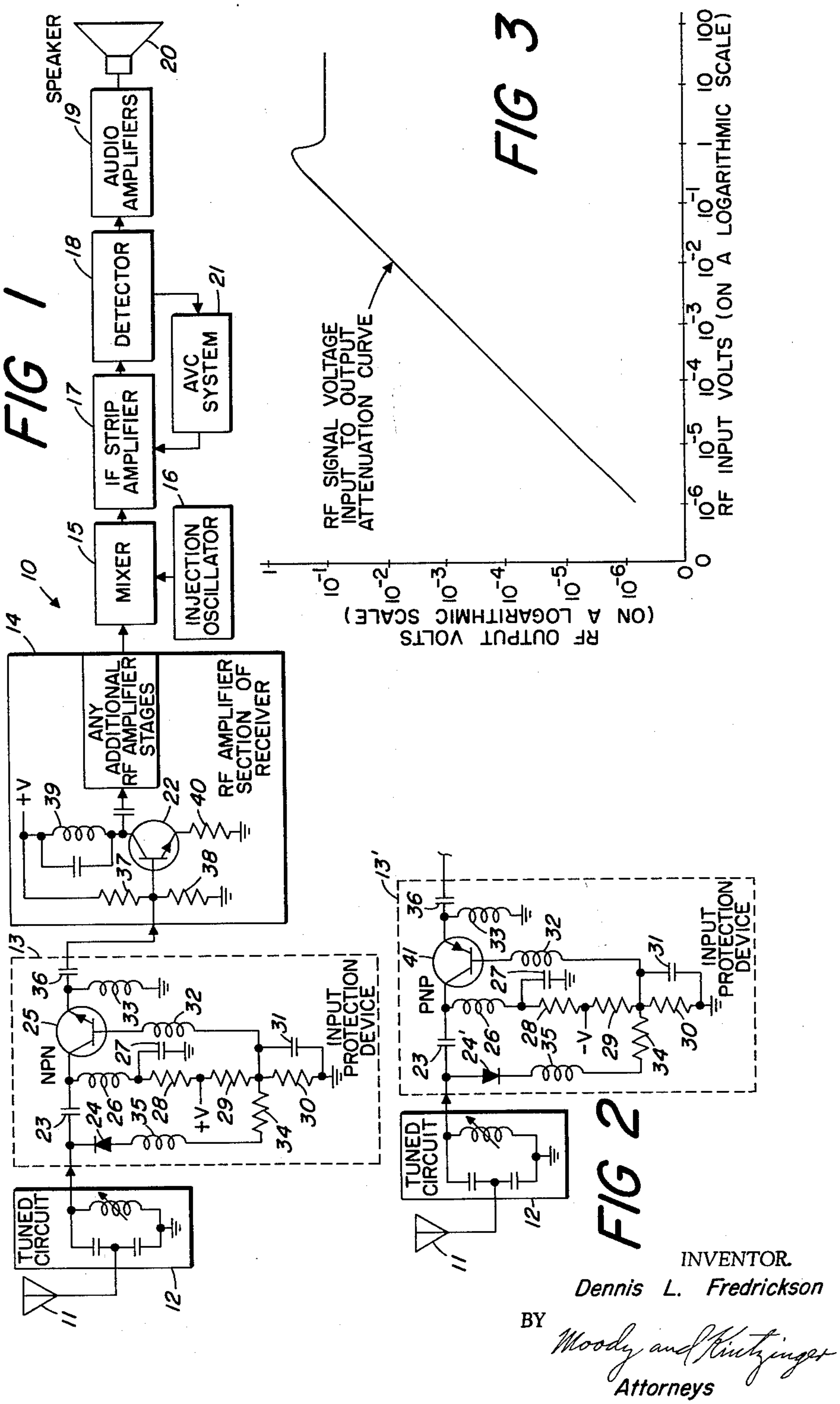

This invention relates in general to circuit overload protection systems, and in particular to a signal overload attenuating circuit for protecting receivers having a solid state RF stage against burnout from strong fields of nearby transmitters.

There are overload protective devices and systems that provide overload protection by circuit shutoff. However, it is important for many radio frequency receivers to provide substantially continuous operation even when overload conditions exist. Input signal overload can be a serious problem with solid state circuitry in an RF amplifying stage, particularly so, since solid state devices such as transistors are current operation devices dissipating substantial amounts of power in the input circuits during normal operation. Thus, excess signal voltages induced on the receiver antenna must be automatically and reliably attenuated to protect the receiver from input signal overload.

It is, therefore, a principal object of this invention to provide circuit overload protection by automatic and variable attenuation of excess signal voltages as determined by the signal voltage.

Another object is to prevent overload burnout of solid state devices in an RF amplifier stage by automatic attenuation of the input signal to various degrees of attenuation as predetermined and as determined by input signal overload.

A further object is to provide for substantially continuous RF receiver operation even though overload conditions exist while providing overload protection by automatic and variable attenuation of excess signal voltage inputs from the receiver antenna.

Features of this invention useful in accomplishing the above objects are the use of a single transistor and a diode which are so connected in an input protective device as to provide a self-actuated variable attenuator circuit having automatically adjusted attenuation as determined by the input signal level received from the antenna. In this solid-state-attenuating-circuit rectifying action of the diode under input signal overload conditions varies the voltage applied at the base of the transistor. This change in voltage at the base of the transistor as imposed by the diode rectifying action, decreases the base to emitter bias taking the transistor out of saturation and further decreases the base to emitter bias with increasing overload signals. The resulting transistor cutoff action increases the collector to emitter resistance and thereby attenuates incoming overload RF signals to safe input voltage levels fed to the RF portion of the receiver.

Specific embodiments representing what are presently regarded as the best modes of carrying out the invention are illustrated in the accompanying drawing.

In the drawing:

FIGURE 1 represents an RF receiver having a solid state RF stage and provided with a self-actuated variable attenuation solid state overload protective circuit utilizing a NPN transistor and a diode;

FIGURE 2, another solid state signal overload self-actuated variable attenuating circuit utilizing a PNP transistor and a diode; and FIGURE 3, a log-log graph illustrating how RF signal output is limited by attenuation at excessive RF signal input voltage levels.

Referring to the drawing:

The embodiments shown are each illustrated as a circuit overload protective device for a radio frequency receiver. In each, the overload protective device is arranged for self-actuated variable attenuation to prevent potentially damaging signal input voltage levels from reaching the receiver RF input stage. Potentially damaging signal voltage levels may arise, for example, when the signal of a transmitter located relatively close to the receiving antenna results in excessive power input to the receiver circuit. In this invention a single transistor and a diode are connected in a circuit in such a manner as to provide a self-actuated attenuator with automatically adjusted attenuation as determined by the input signal received from the antenna. The diode acts as a rectifier under signal overload conditions and through a voltage summing network provides an opposing voltage to the biasing voltage normally applied to the base of the transistor. This provides a transistor biasing action by varying the voltage at the base of the transistor as a function of RF signal input voltage overload. The transistor is taken out of its normally operating saturated state when the RF input signal is in an overload state and with increasing overload further decreases the base to emitter bias of the transistor. The resulting attenuating action of the transistor prevents damaging RF signal voltage levels from reaching the RF amplifying portion of the receiver. Further, the antenna is connected to feed the RF signals sensed to the collector of the attenuating transistor for taking protective advantage of relatively high collector voltage breakdown characteristics as high as 100 volts or even higher. In this circuit the transistor is normally maintained in the saturated state by a D.C. voltage applied at the base with the emitter to collector circuit acting like a short and normal RF signals being passed substantially unimpeded. When the base voltage is so reduced that the transistor is no longer saturated, high impedance exists between the emitter and collector as determined by RF signal overload.

The superheterodyne receiver 10 of FIGURE 1 receives an RF signal from antenna 11. Antenna 11 is connected through tuned circuit 12 and input protective device 13 to RF stage 14, or stages, as the case may be. The output of the RF portion of the receiver is fed to mixer 15 where it is mixed with the high frequency signal of oscillator 16. The output of mixer 15 is fed to IF amplifier 17 and is passed successively through detector 18, and audio amplifier 19 to speaker 20. An AVC circuit 21 provides for applying the automatic volume control signal voltage, derived from detector 18, to the IF amplifier 17 in a conventional manner. The overload input protective device 13 provides for self-actuated variable attenuation with the level of attenuation automatically adjusted in accordance with the RF input signal received from the antenna. This prevents potentially damaging signal input voltage levels from reaching the input of receiver RF stage 14. The output of input protective device 13 is shown to be coupled to first RF stage amplifying transistor 22 in a conventional manner. Generally, use of a solid state transistorized RF input stage in receiver 10 multiplies from 10 to 20 times in severity the signal overload problem encountered with a tube type RF input stage.

Referring in greater detail to the receiver overload input protective device 13, the antenna feed line is connected to both a capacitor 23 and the cathode of a diode 24. The receiver side of capacitor 23 is connected to the collector of NPN transistor 25 and to a coil-resistor network. This network includes an RF choke coil 26 connected at one end to both capacitor 23 and the collector of transistor 25, and at the other end through a capacitor 27 in an RF shorting path to ground and through resistor 28 to a positive direct current supply. The direct current supply is also connected serially through resistors 29 and 30 to ground. The junction of resistors 29 and 30 is RF shorted to ground through capacitor 31 and is also connected to the base of transistor 25 through RF choke coil 32. Thus, the positive voltage supply is connected for maintaining a predetermined direct current collector-to-base bias on transistor 25 during normal signal overload conditions. With the emitter of transistor 25 connected to ground through RF choke coil 33, the positive voltage supply maintains proper predetermined emitter to base bias for the transistor 25 during normal operation. The junction of resistors 29 and 30 is also connected through resistor 34 and RF choke coil 35 to the anode of diode 24. The emitter of transistor 25, in addition to being connected through coil 33 to ground, is connected through capacitor 36 to the junction of resistors 37 and 38, and also to the base of the first RF stage amplifying transistor 22 in a conventional manner. Resistors 37 and 38 are connected between a positive voltage supply and ground in the RF amplifier section and the positive voltage is also connected through coil 39 to the collector of transistor 22 while the emitter is connected through resistor 40 to ground.

In operation, protective device 13 with normal RF signal input voltages is operated with transistor 25 in a saturated condition. The components of protective device 13 are so chosen and such D.C. voltage supplied that as long as normal RF signal voltage inputs are received from antenna 11, transistor 25 remains in the saturated state. However, when RF signal input voltages exceed a predetermined overload threshold level, rectification begins at diode 24 and a D.C. voltage is thereby provided at the anode of diode 24 opposite in polarity to the positive voltage supplied at the junction of resistors 28 and 29. This voltage produced by rectification is combined with the voltage of the positive voltage supply through the resistors 29, 30, and 34 acting as a summing network to lower the voltage potential applied at the base of transistor 25. This, of course, reduces the base-to-emitter bias and takes transistor 25 out of saturation. Since the degree of base-to-emitter bias controls collector to emitter resistance and with decreasing bias increases this resistance, the RF signal voltage level from the antenna is attenuated to safe signal voltage input levels to the base of transistor 22. This attenuation may run as high as 40 to 60 db depending upon the choice of transistor 25 and other components used with transistor 25 in input protective device 13. It should be noted that the circuit is completely automatic and is automatically returned to normal operation whenever all relatively strong RF input levels are removed.

Protection is provided for the input tuned circuits of the receiver from burnout by exceptionally strong signals near the receiver operating frequency. Hence, the overload input protective device 13 is a broadband voltage signal sensing protecting device. On occasion, therefore, an exceptionally strong signal off the receiver tuned frequency sensed by the receiver antenna creates an overload state actuating the signal attenuating protective device 13. Further, the off frequency signal may be so much stronger than the RF signal at the tuned frequency that resulting attenuation through transistor 25 so attenuates and submerges the tuned signal input as to reduce it below the sensing level of the RF stages of the receiver. Such overload attenuation resulting from off frequency overload signals may be minimized by a properly designed tuned circuit 12. Hence, as a general rule hereinbefore stated, receiver 10 remains in substantially continuous operation even though overload conditions exist, and particularly so if the overload is occasioned by an RF signal sensed by the antenna at the tuned frequency of the receiver.

Components used for testing such a signal overload device for a receiver include the following:

| | | |
|---|---|---|
| Capacitor **23** | μμf | 1000 |
| Diode **24** | | 1N916 |
| NPN transistor **25** | | 2N703 |
| Coil **26** | μh | 39 |
| Capacitor **27** | μf | 0.1 |
| Capacitor **28** | ohms | 2.2K |
| Resistor **29** | do | 10K |
| Resistor **30** | do | 2.2K |
| Capacitor **31** | μμf | 0.1 |
| Coil **32** | μh | 39 |
| Coil **33** | μh | 39 |
| Resistor **34** | ohms | 3.9K |
| Coil **35** | μh | 39 |
| Capacitor **36** | μμf | 1000 |
| B+ voltage supplied | volts | +20 |

The signal voltage input-output attenuation curve as illustrated in FIGURE 3 graphically portrays the attenuation protection provided with RF input overload signal voltages with an input protective device 13 utilizing the above identified components. It is interesting to note that attenuation is substantially constant at a relatively low figure of approximately 0.5 db up to an RF signal input voltage level in the range of approximately ½ to ¾ volt. Thereafter, with increasing RF input signal voltage levels and with rectification beyond the threshold of signal voltage rectification through diode 24, voltage at the base of transistor 25 is lessened and signals through transistor 25 are attenuated as a function of input signal overload. It should be noted that the signal attenuating action of input protective device 13 will also provide improved RF signal voltage overload protection for input circuits of tube type receivers.

In the embodiment of FIGURE 2 wherein portions of the circuit not illustrated are the same as in the embodiment of FIGURE 1, similar components are, for the sake of convenience, numbered the same. In this embodiment PNP transistor 41 is employed in place of the NPN transistor 25 of FIGURE 1. A minus D.C. voltage is applied to the junction of resistors 28 and 29 instead of the positive B+ voltage of FIGURE 1. In addition, diode 24' is reversed in the circuit from the orientation of diode 24 in the embodiment of FIGURE 1. Attenuating performance with this input protective device 13' gives substantially the same RF signal attenuating protection as provided by the input protective device 13 of the FIGURE 1 embodiment. The action of diode 24' in rectifying overload input signals provides a positive voltage acting through the summing network of resistors 29, 30, and 34 in combination with the minus voltage supplied to raise the voltage applied at the base of PNP transistor 41. When this voltage at the base of transistor 41 is raised higher than when the transistor is operated in the fully saturated state PNP transistor 41 attenuates the RF overload input voltages to safe RF input voltage levels fed to RF section 14. Raising of the transistor 41 base voltage decreases the base to emitter bias and results in overload attenuating action through transistor 41 comparable to overload attenuation provided through the transistor 25 of the FIGURE 1 embodiment.

Whereas this invention is here illustrated and described with respect to several embodiments thereof, it should be realized that various changes may be made without departing from the essential contributions to the art made by the teachings hereof.

I claim:

1. In a radio frequency receiving system having an antenna and a receiver with an RF amplifier; an RF input signal overload attenuating protective device inserted in the antenna to RF amplifier signal path; means providing an RF input signal voltage path from said antenna to said protective device; means for feeding RF signal output voltages from said protective device as an input to said RF amplifier; and with said protective device including: a transistor having an emitter, base, and collector; said means providing an RF input signal voltage path from the antenna being connected to the collector of said transistor; said emitter being connected to the means for feeding said RF signal output voltages from the protective device as an input to said RF amplifier; said emitter also being connected through impedance means to ground; a direct current supply; a first impedance circuit between said D.C. supply and the collector of said transistor; second impedance circuit means connecting said D.C. supply to the base of said transistor; portions of said second impedance means between said D.C. supply and the base of said transistor forming part of a voltage summing network; RF signal voltage rectifying means connected between said RF input signal voltage path from the antenna and said voltage summing network; said RF signal voltage rectifying means being a diode connected through a coil to said voltage summing network; said first impedance circuit including a serially connected resistor and coil; said voltage summing network including two resistors connected between the D.C. supply and ground and an additional resistor connecting the diode circuit to the junction of the two resistors between the D.C. supply and ground; and the common junction of said summing network being connected both through a coil to the base of said transistor and through a capacitor to ground.

2. In the radio frequency receiving system of claim 1, a tuned circuit in said RF input signal path from said antenna to said protective device; and wherein said RF amplifier is provided with a transistorized input stage.

3. The protective device of claim 1, wherein said transistor is an NPN transistor; said diode being connected in the circuit with the cathode connected to said RF signal input means, and with the anode connected to said voltage summing network; and said D.C. supply being a positive voltage supply.

4. The protective device of claim 1, wherein said transistor is a PNP transistor; said diode being connected in the circuit with the anode connected to said RF signal input means, and with the cathode connected to said voltage summing network; and said D.C. supply being a negative voltage supply.

References Cited in the file of this patent

UNITED STATES PATENTS

| | | |
|---|---|---|
| 3,015,726 | De Metrick | Jan. 2, 1962 |
| 3,035,170 | Webster | May 15, 1962 |
| 3,052,853 | Smith | Sept. 4, 1962 |
| 3,061,785 | Battin | Oct. 30, 1962 |